United States Patent [19]
Yamada

[11] Patent Number: 5,986,939
[45] Date of Patent: Nov. 16, 1999

[54] NON-VOLATILE SEMICONDUCTOR MEMORY DEVICE

[75] Inventor: Kouichi Yamada, Hashima-Gun, Japan

[73] Assignee: Sanyo Electric Co., Ltd., Osaka, Japan

[21] Appl. No.: 09/219,861

[22] Filed: Dec. 23, 1998

[30] Foreign Application Priority Data

Dec. 24, 1997 [JP] Japan ..................................... 9-355508
Sep. 30, 1998 [JP] Japan ................................... 10-277358

[51] Int. Cl.$^6$ ................................................ G11C 16/04
[52] U.S. Cl. .............................. 365/185.29; 365/185.14; 365/185.18; 365/185.2; 365/185.21
[58] Field of Search ......................... 365/185.21, 185.29, 365/185.22, 185.18, 185.14, 185.2

[56] References Cited

U.S. PATENT DOCUMENTS

| | | | |
|---|---|---|---|
| 5,237,534 | 8/1993 | Tanaka et al. ............................ | 365/208 |
| 5,396,458 | 3/1995 | Shimoji .................................... | 365/185 |
| 5,414,654 | 5/1995 | Kubota et al. ........................... | 365/145 |
| 5,694,356 | 12/1997 | Wong et al. ........................ | 365/185.03 |
| 5,721,707 | 2/1998 | Villa et al. ............................... | 365/218 |
| 5,724,300 | 3/1998 | Tanaka et al. ....................... | 365/230.06 |
| 5,751,632 | 5/1998 | Choi et al. ........................... | 365/185.03 |
| 5,856,944 | 1/1999 | Prickett, Jr. et al. ............... | 365/185.29 |

*Primary Examiner*—David Nelms
*Assistant Examiner*—Hien Nguyen
*Attorney, Agent, or Firm*—Armstrong, Westerman, Hattori, McLeLand & Naughton

[57] ABSTRACT

There is disclosed a non-volatile semiconductor memory in which writing and erasing are easily controlled. When electrons are supplied to a floating gate while a memory cell is in a writing condition, a channel is off. Therefore, there is little capacitive coupling between a control gate, a source and a drain. Even when the electric potential of a word line is raised to vary the electric potential of the source and the drain, the electric potential of the control gate hardly varies. Moreover, when electrons are extracted from the floating gate while the memory cell is in an erasing condition, the channel is on. Therefore, a capacitive coupling is generated between the control gate and the source and the drain. When the electric potential of the word line is raised to vary the electric potential of the source and the drain, the electric potential of the control gate varies accordingly. Since the data value is determined by the variation in the electric potential of the control gate, a complicated control heretofore necessary for preventing excess erasing is unnecessary.

18 Claims, 5 Drawing Sheets

NON-VOLATILE SEMICONDUCTOR MEMORY DEVICE

BACKGROUND OF THE INVENTION (i) Field of the Invention

The present invention relates to a non-volatile semiconductor memory device, particularly to a non-volatile semiconductor memory device which can electrically be rewritten.

(ii) Description of the Related Art

Recently, with the greatly increased prevalence of cellular phones, digital still cameras or other small-size information apparatus, there has been an increasing demand for ferroelectric random access memory, EPROM (Erasable and Programmable Read Only Memory), EEPROM (Electrical Erasable and Programmable Read Only Memory), flash memory or other non-volatile semiconductor memories that can electrically be rewritten. EEPROM, especially, can easily update firmware after products are delivered or repeatedly store photographed images. Flash memory, also termed flash EEPROM, is capable of performing data erasures in all memory storage areas or in selected block storage areas. The flash memory of which each memory cell is constituted of one transistor has an advantage that it can be more easily highly integrated than EEPROM.

FIG. 4 shows an example of a prior art cell transistor 30 constituting a memory cell of a flash memory. The cell transistor 30 is termed a stacked gate type, in which two gate electrodes GP, i.e., a floating gate FG, and a control gate CG are alternately stacked.

When data is written into the cell transistor 30, for example, as shown in FIG. 5A, an electric potential of 5 V is applied to a source S of the cell transistor 30 selected via a bit line BL, while an electric potential of 12 V is applied to the control gate CG via a word line WL. In this condition, the electric potential of the floating gate FG is increased, and hot electrons generated in the vicinity of the source S are supplied to the floating gate FG. Additionally, the bit line BL and the word line WL not connected to the selected cell transistor 30, and the drains D of the cell transistors 30 are set to 0 V via the common drain line DL.

When the electrons are supplied to the floating gate FG, the floating gate FG is negatively charged. Therefore, a channel CH formed between the source S and the drain D is turned off.

When the data is erased from the cell transistors 30, as shown in FIG. 5B, the control gates CG of all cell transistors 30 are set to 0 V via the word lines WL. Additionally, all bit lines BL, i.e., the sources S of all cell transistors 30 are opened. Moreover, an electric potential of 15 V is applied to the drain of each cell transistor 30 via the common drain line DL. In this condition, the electrons in the floating gate FG are extracted toward the drain D by a FN (Fowler-Nordheim) tunnel current. The erasing operation is performed for all cell transistors 30 or for the cell transistors 30 in the selected block.

When the electrons of the floating gate FG are extracted, the floating gate FG is charged positive. Therefore, the channel CH formed between the source S and the drain D is placed in a condition in which it can be turned on, i.e., it is turned on when selected.

When data is read from the cell transistor 30, as shown in FIG. 5C, an electric potential of 2.5 V is applied to the source S of the cell transistor 30 selected via the bit line BL, an electric potential of 5 V is applied to the control gate CG via the word line WL, and an electric potential of 0 V is applied to the drain D via the common drain line DL.

During reading, the electric current flowing between the source S and the drain D of the cell transistor 30 varies in magnitude in accordance with whether the channel CH of the cell transistor 30 is turned on or off. Specifically, in the erasing condition in which the channel CH is on, the electric current more easily flows between the source S and the drain D than the writing condition in which the channel CH is off. Therefore, if the difference of the electric current is detected by a sense amplifier connected to the bit line BL, the value of the data stored in the memory cell can be read.

In an actual memory chip having multiple cell transistors 30, subtle variation may be generated in the erasing/writing characteristics of the cell transistors 30. As a result, for example, even when the same electric potential is applied to the cell transistors 30 to erase the data therefrom, the electric potential necessary for the erasing is reached in some cell transistors 30, but the necessary electric potential may not be reached in other cell transistors 30.

In this case, if the electric potential of the cell transistor 30 in which erasing can easily be performed is raised in accordance with the cell transistor 30 in which erasing cannot be easily performed, the electrons are excessively extracted from the floating gate FG of the cell transistor 30 in which erasing is easily performed, and the channel CH is constantly turned on. This causes a problem that a reading error is generated by the electric current of the cell transistor 30 which is not selected at the time of reading. The problem of so-called excessive erasing is caused.

To solve the problem, following methods have been heretofore performed:

(1) When data is written, the time for supplying electrons to the floating gate FG is adjusted to control the amount of electric charges of the floating gate FG, so that the electrons are prevented from being excessively supplied to that floating gate FG. Moreover, when data is erased, the time for extracting the electrons from the floating gate FG is adjusted to control the amount of electric charges of the floating gate FG, so that the electrons are prevented from being excessively extracted from the floating gate FG.

(2) At the time of writing data, after writing is performed for the predetermined time, a verification reading is performed to confirm whether or not excess electrons are supplied to the floating gate FG. By repeating the writing and the verification reading, the amount of electric charges of the floating gate FG is controlled. Moreover, at the time of erasing data, after erasing is performed for the predetermined time, verification reading is performed to confirm whether or not excess electrons are extracted from the floating gate FG. By repeating the erasing and the verification reading, the amount of electric charges of the floating gate FG is controlled.

(3) At the time of writing data, after writing is performed, verification reading is performed. Subsequently, after the electric potentials of the word line WL and the bit line BL are slightly raised, writing is performed again. Thereafter, a verification reading is performed. By repeating the writing and the verification reading, the electric potentials of the word line WL and the bit line BL are gradually raised to perform writing, so that the amount of electric charges of the floating gate FG is controlled. At the time of erasing data, after erasing is performed, a verification reading is performed. Subsequently, after the electric potential of the common drain line DL is slightly raised, erasing is performed again. Thereafter, a verification reading is performed. By repeating the erasing and the verification reading, the electric potential of the common drain line DL is gradually raised to perform erasing, so that the amount of electric charges of the floating gate FG is controlled.

(4) Before erasing data, data is written to the cell transistor 30 in which data is not yet written. After all cell transistors 30 are placed in the writing condition, an erasure is performed.

Since the above controls (1) to (4) are complicated, there is a problem that control circuit structures are complicated. Another problem is that the operation speed of the memory is lowered to perform the complicated control.

Recently, in order to enhance the integration degree of the flash memory, there has been proposed a multilevel memory in which three or more values are stored, instead of storing two values (one bit), i.e., the erasing and writing conditions in each memory cell.

Even in the multilevel memory, the excess erasing needs to be prevented. For the purpose, the threshold voltage of the cell transistor 30 needs to be controlled in a range of voltages in which excess erasing is not performed. Since the narrow voltage range needs to be divided into plural sections to correspond to each data value, it is disadvantageously difficult to control the threshold voltage.

SUMMARY OF THE INVENTION

An object of the present invention is to provide a non-volatile semiconductor memory device in which writing and erasing are easily controlled.

Another object of the present invention is to provide a non-volatile semiconductor memory device in which writing and erasing are easily controlled and three or more values can be stored in each memory cell.

To attain these and other objects, the present invention provides a non-volatile semiconductor memory device which includes a plurality of memory cells, a word line and a bit line, a sense amplifier, and a condition determining means. The memory cell has a source, a drain, a channel between the source and the drain, a floating gate and a control gate. The floating gate accumulates an electric charge corresponding to a difference between the electric potential of at least one of the source and the drain and the electric potential of the control gate. The channel is turned on or off in accordance with the condition of the electric charge.

The word line is connected to at least one of the source and the drain of the memory cell, while the bit line is connected to the control gate. The bit line is connected to the sense amplifier for sensing the electric potential of the control gate. When the electric potential of at least one of the source and the drain of the memory cell is varied via the word line, and the channel is turned on, the electric potential of the control gate fluctuates in accordance with the electric potential fluctuation of at least one of the source and the drain. The electric potential of the control gate is detected by the sense amplifier. The condition determining means determines in accordance with the output of the sense amplifier whether the memory cell is in the erasing condition or the writing condition.

In the present invention, when the electric current is not flowing between the source and the drain and the electric potential of the word line is varied, the data value is determined by determining whether or not the electric potential of the control gate varies. Therefore, there is no possibility of excessive erasure and complicated reading control is unnecessary. This simplifies the structure, reduces cost, and improves operation speed.

In another aspect of the present invention, after the electric potential of the control gate of the memory cell is set to a first electric potential by the bit line, the electric potential of at least one of the source and the drain of the memory cell is varied by the word line. In this case, the data value of a high order bit written in the memory cell is determined by ascertaining whether or not the electric potential of the control gate varies. Furthermore, after the electric potential of the control gate of the memory cell is set to a second electric potential which is higher than the first electric potential by the bit line, the electric potential of at least one of the source and the drain of the memory cell is varied by the word line. The data value of the low order bit written in the memory cell is determined by ascertaining whether or not the electric potential of the control gate varies.

According to this aspect of the present invention, the multi-valued data consisting of the high order bit and the low order bit written in the memory cell can easily be read by changing the electric potential of the bit line twice, i.e., to the first and second electric potentials.

In a further aspect of the present invention, after the electric potential of the control gate is set to an intermediate electric potential of the first and second electric potentials, the electric potential of at least one of the source and the drain of the memory cell is varied by the word line. In this case, the data value of the intermediate bit of the high and low order bits written in the memory cell is determined by ascertaining whether or not the electric potential of the control gate varies.

According to this aspect of the present invention, when the electric potential of the bit line is varied to the first, second and further intermediate electric potentials repeatedly many times, the multi-valued data consisting of a plurality of bits written into the memory cell can easily be read in accordance with the frequency of the variation.

BRIEF DESCRIPTION OF THE DRAWINGS

The present invention will be described, by way of example, with reference to the accompanying drawings, in which.

DETAILED DESCRIPTION OF THE PREFERRED EMBODIMENTS

First Embodiment

Figure 1:
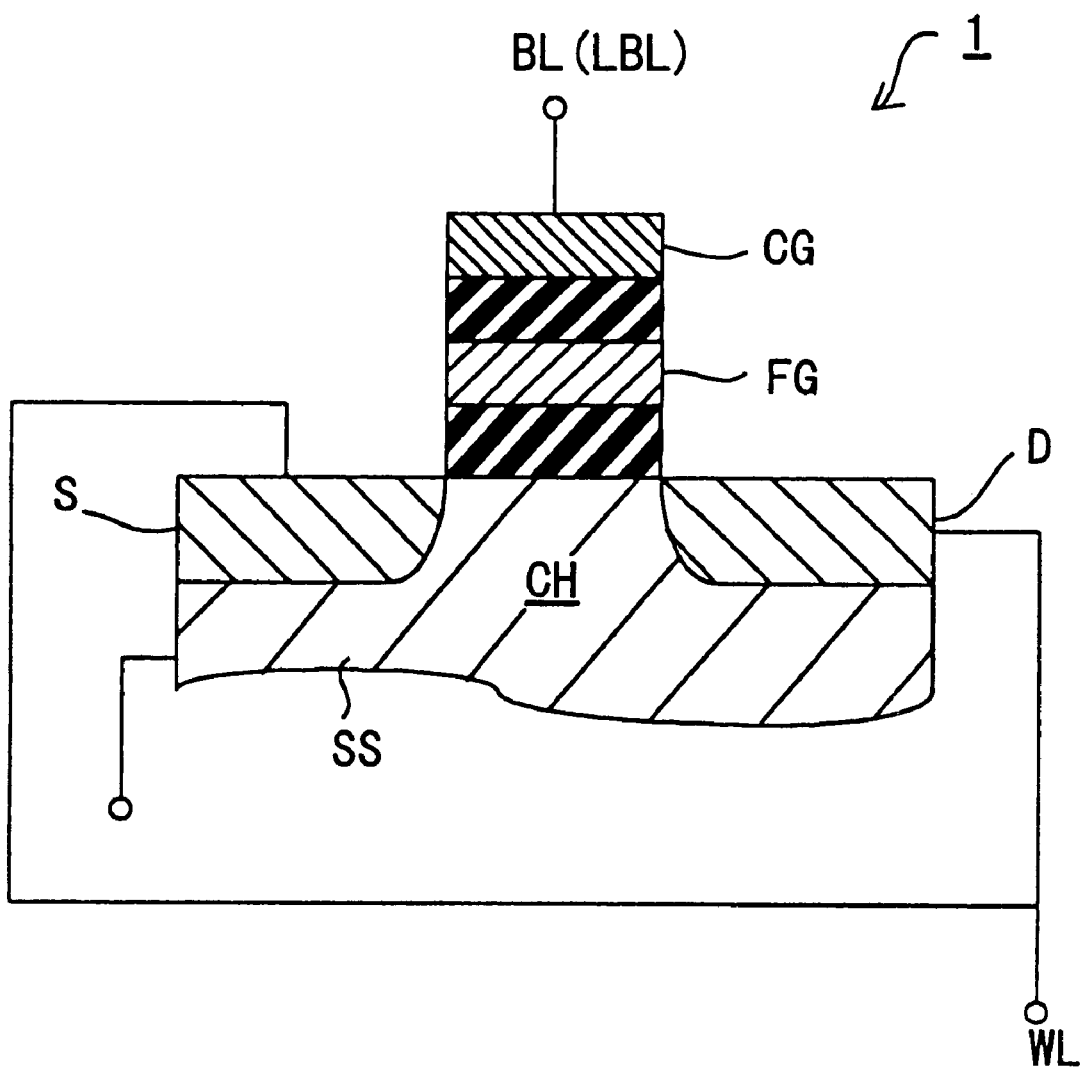
FIG. 1 is a diagrammatic sectional view of a cell transistor for use in a non-volatile semiconductor memory according to the first and second embodiments of the present invention.

As shown in FIG. 1, a memory cell 1 is provided with a source S, a drain D, a floating gate FG and a control gate CG. The floating gate FG is surrounded with an insulating film, and is electrically floating. Binary data is stored in the memory cell 1 depending on whether or not electrons are accumulated in the floating gate FG. Specifically, the data value is determined by determining whether a channel CH between the source S and the drain D is turned on or off.

The non-volatile semiconductor memory device of the first embodiment is different from the conventional memory, in that the data value is determined by variation of the electric potential of the control gate CG, not by the variation of the electric current flowing between the source S and the drain D.

Specifically, when electrons are accumulated in the floating gate FG and the channel CH is off, the electric potential of the control gate CG hardly varies even if the electric potential of the source S or the drain D is varied.

Conversely, when electrons are extracted from the floating gate FG, the channel CH is turned on, and the source S and the drain D are in conductive conditions. Therefore, if the electric potential of the source S or the drain D is varied, the electric potential of the control gate CG is also varied by capacitive coupling.

In order to sense a variation in the electric potential of the control gate CG, in the non-volatile semiconductor memory of the embodiment, the source S and the drain D of the memory cell 1 are connected to a word line WL, while the control gate CG is connected to a bit line BL.

Figure 2:
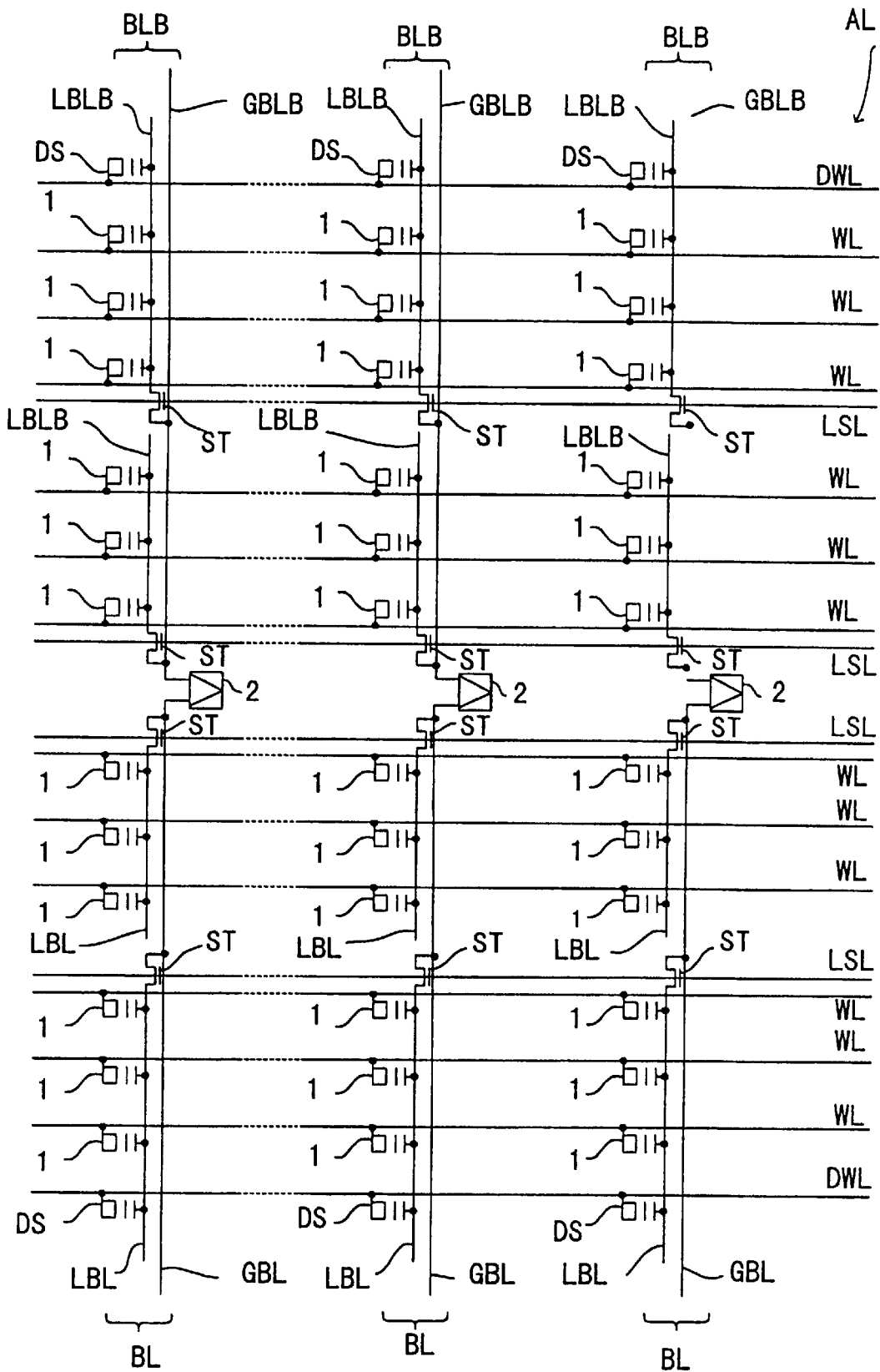
FIG. 2 is a circuit diagram of the memory cell array of the non-volatile semiconductor memory according to the first and second embodiments.

As shown in FIG. 2, a cell array AL has a structure in which a pair of bit lines BL and BLB, electrically equivalent to each other, are arranged symmetrically relative to the differential sense amplifier 2. The structure is generally termed an "open-type bit line structure".

The same number of memory cells 1 are connected to the bit lines BL and BLB. The sense amplifier 2 senses the electric potential of the control gate CG of each memory cell 1 via the bit lines BL and BLB to determine the data value of each memory cell 1.

The data value is determined by the sense amplifier 2 by comparing the signal voltage appearing on either one of the bit lines BL and BLB with the reference voltage appearing on the other bit line BLB or BL.

The sense amplifier 2 amplifies the voltage between the pair of the bit lines BL and BLB. Therefore, when the signal voltage is larger than the reference voltage, the output becomes positive. On the other hand, when the signal voltage is smaller than the reference voltage, the output becomes negative. The positive condition corresponds to the data value of "1", while the negative condition corresponds to the data value of "0".

The reference voltage is usually set to the intermediate value between the maximum and minimum values of the signal voltage. In order to generate the reference voltage on the bit lines BL and BLB, a dummy cell DS similar in structure to the memory cell 1 is used.

As an example, the electrostatic capacity of the dummy cell DS is set to the half of the electrostatic capacity of the memory cell 1. The dummy cell DS is set in an erasing condition, and the outputted voltage therefrom is constant at the intermediate value.

One dummy cell, corresponding to each of the predetermined number of memory cells 1 connected to the bit lines DL and BLB, is connected to each of the bit lines BLB and BL. When the memory cell 1 to be read is selected, the corresponding dummy cell DS is simultaneously selected via a dummy word line DWL.

Additionally, the bit line BL or BLB is constituted of a global bit line GBL or GBLB directly connected to the sense amplifier 2 and a local bit line LBL or LBLB directly connected to each memory cell 1.

The global bit line CBL or GBLB is connected to a plurality of local bit line LBL or LBLB via transistors ST.

The transistor ST is turned on/off by the electric potential of a selecting line LSL. When the transistor ST is turned on by the selecting line LSL, corresponding local bit line LBL or LBLB is connected to the sense amplifier 2 via the global bit line GBL or GBLB.

Specifically, when cell data is read, the local bit line LBL or LBLB other than the local bit line LBL or LBLB connected to the memory cell 1 to be read is cut from the global bit line GBL or GBLB by the transistor ST, so that the entire electrostatic capacity of the bit line BL or BLB is reduced as low as possible at the time of reading. Moreover, the variation amount of the electric potential of the bit line is prevented from being reduced.

Figure 3:
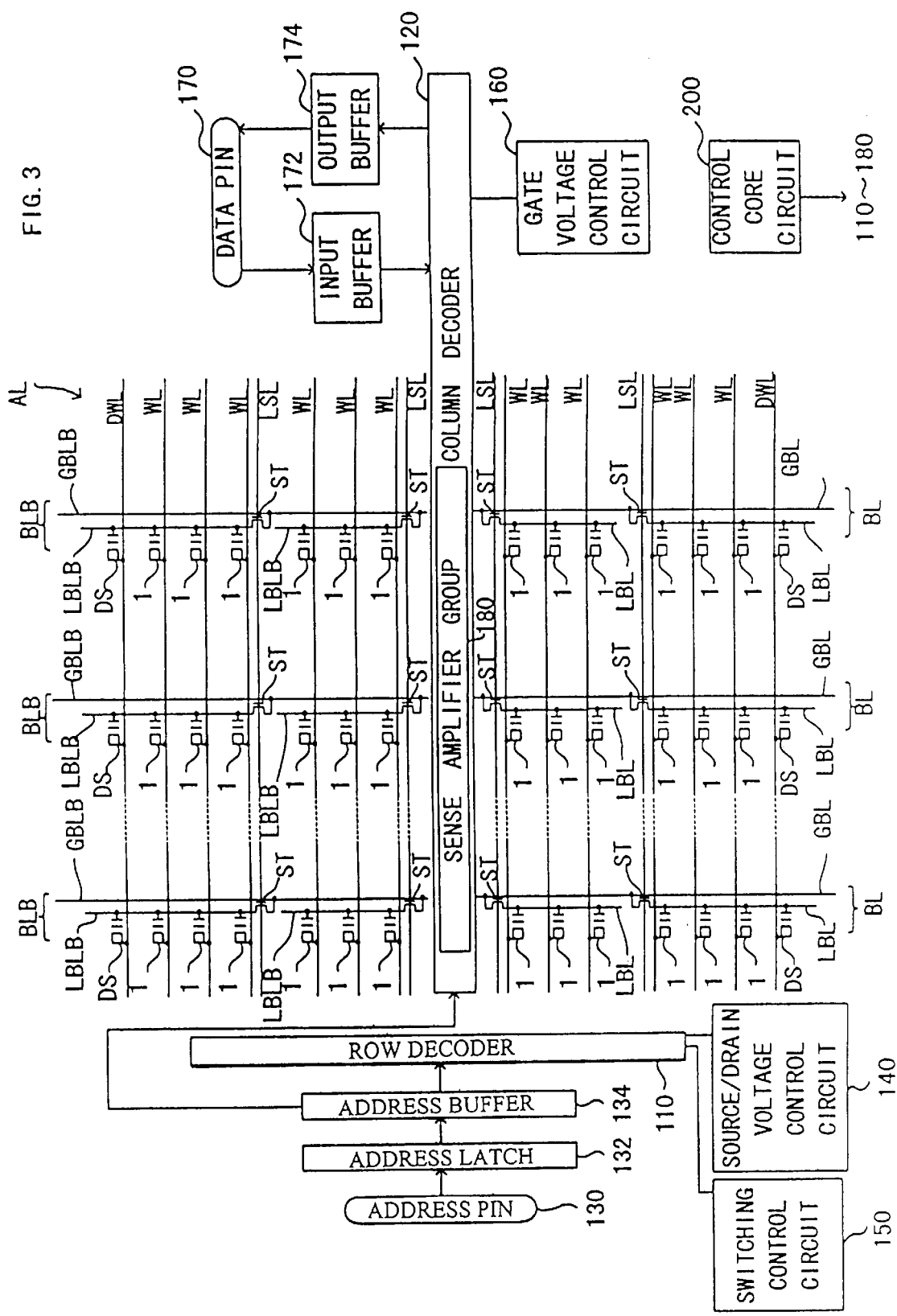
FIG. 3 is a block diagram of a flash memory using the memory cell array shown in FIG. 2.
Figure 4:
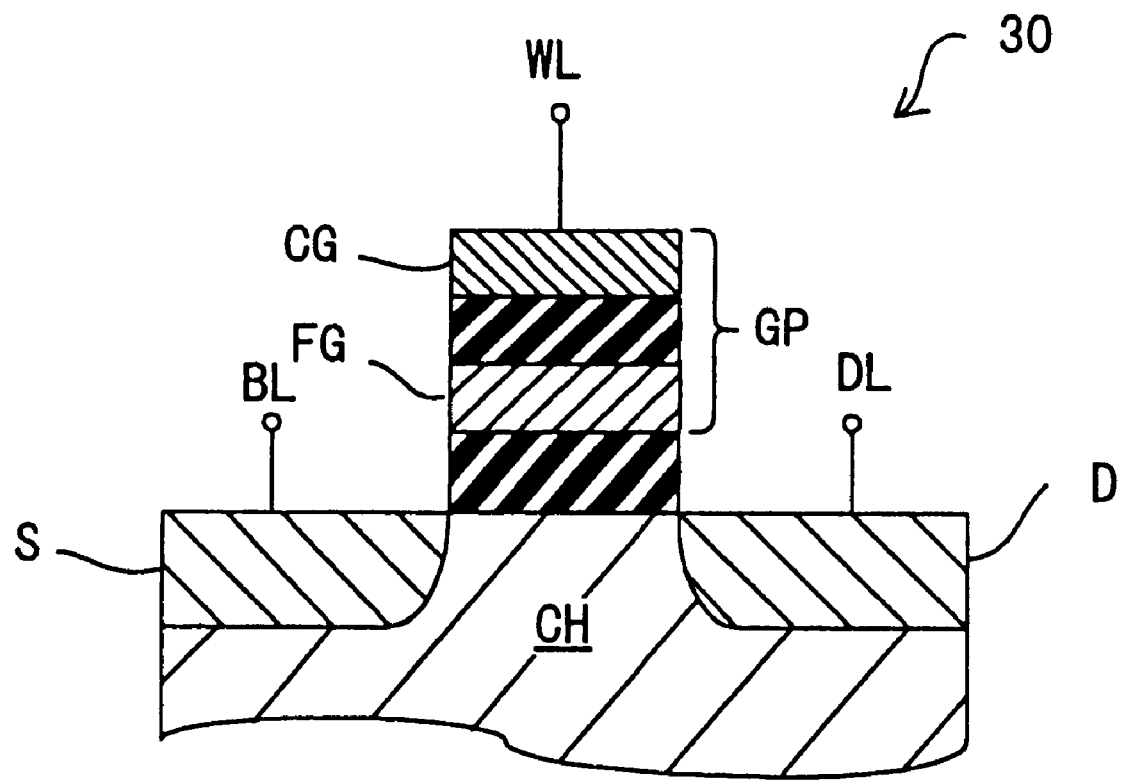
FIG. 4 is a diagrammatic sectional view of a conventional cell transistor.
Figure 5A:
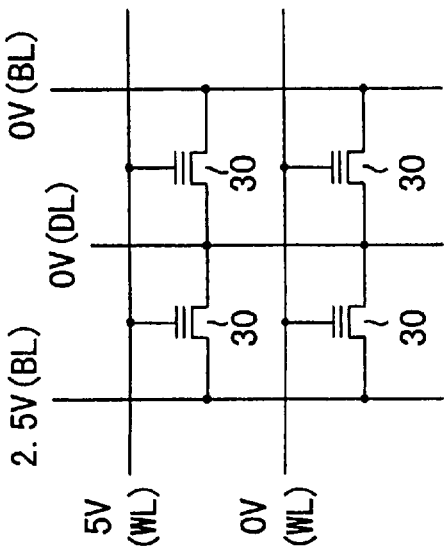
FIGS. 5A to 5C are circuit diagrams showing the operation of a conventional memory cell.
Figure 5B:
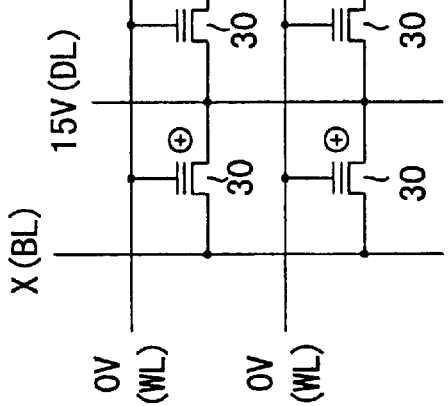
Figure 5C:
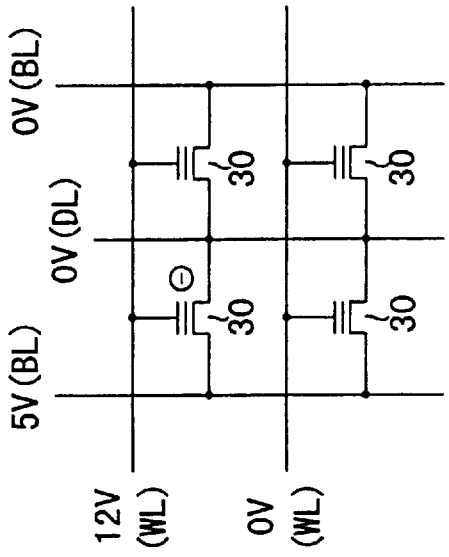

Referring to the block diagram of the flash memory shown in FIG. 3, each word line WL, each dummy word line DWL and each selecting line LSL are connected to a row decoder 110, while each bit line BL or BLB is connected to a column decoder 120. The row address and the column address designated from the outside are transmitted to an address pin 130. The row address and the column address are transferred to an address buffer 134 from the address pin 130 via an address latch 132. For the addresses stored in the address buffer 134, the row address is transferred to the row decoder 110, and the column address is transferred to the column decoder 120.

The row decoder 110 selects one word line WL corresponding to the row address and the corresponding dummy word line DWL, and connects the selected word line WL and dummy word lines DWL to a source/drain voltage control circuit 140. The source/drain voltage control circuit 140 generates a voltage to be supplied to the source/drain of the memory cell 1 and the dummy cell DS, as described later. The row decoder 110 also connects the selecting line LSL to a switching control circuit 150. The switching control circuit 150 generates a voltage, which is supplied to the selecting line LSL to turn on/off the transistor ST.

The column decoder 120 selects the bit lines BL and BLB corresponding to the column address, and connects the selected bit lines BL and BLB to a gate voltage control circuit 160. The gate voltage control circuit 160 generates a voltage to be supplied to the control gate CG, as described later.

The data designated from the outside is transmitted to a data pin 170. The data is transferred to the column recorder 120 from the data pin 170 via an input buffer 172.

The data read from the memory cell 1 is transferred to a group 180 of sense amplifiers 2 via the bit lines BL and BLB. The data determined by the sense amplifier group 180 is transmitted to the outside from an output buffer 174 via the data pin 170.

The operation of the aforementioned circuits 110 and 180 is controlled by a control core circuit 200.

In the non-volatile semiconductor memory device described above, when data is written to the memory cell 1, a low electric potential, for example, of 0 V is applied to the source S, the drain D and a substrate SS via the word line WL. Moreover, when the transistor ST is turned on by the selecting line LSL, the local bit line, for example, LBL connected to the memory cell 1 to be written is selected. A high electric potential, for example, of 20 V is applied to the control gate CG of the memory cell 1 via the selected local bit line LBL. In this condition, the electric potential of the floating gate FG is pulled up by the electric potential applied to the control gate CG. Therefore, a high electric potential difference is generated between the floating gate FG and the substrate SS. Electrons are supplied to the floating gate FG by a generated FN (Fowler-Nordheim) tunnel current. When the electrons are supplied to the floating gate FG, the channel CH between the source S and the drain D is turned off. For the memory cell 1 connected to the local bit line LBL to which the high electric potential of 20 V is applied, the word line WL of the non-selected cell has an electric potential of 10 V. Therefore, the non-selected cell has a smaller electric potential difference as compared with the selected cell, and no FN tunnel current is generated in the non-selected cell.

Furthermore, when data is erased from the memory cell 1, a high electric potential, for example, of 20 V is applied to the source S, the drain D and the substrate SS of the object memory cell 1 via the word line WL. The corresponding transistor ST is turned on by the selecting line LSL, the local bit line, for example, LBL connected to the object memory cell 1 is selected, and a low electric potential, for example, of 0 V is applied to the control gate CG of the memory cell 1 via the selected local bit line LBL. In this condition, the electrons are extracted from the floating gate FG toward the substrate SS by FN tunnel current. Therefore, the floating gate FG is charged positive, and the channel CH between the source S and the drain D is turned on.

Subsequently, when the stored data value is read from the object memory cell 1, the electric potential of the source S and the drain D is varied from 0 V to 5 V via the word line WL. In this case, the variation amount of the electric potential of the control gate CG varies depending on whether the channel CH between the source S and the drain D is turned on or off.

While the object memory cell 1 is in a writing condition and the electrons are supplied to the floating gate FG, the channel CH is turned off. Therefore, there is little capacitive coupling between the control gate CG and the source S and the drain D. Even if the electric potential of the word line WL is raised to vary the electric potential of the source S and the drain D, the electric potential of the control gate CG hardly varies.

On the other hand, while the object memory cell 1 is in an erasing condition and the electrons are extracted from the floating gate FG, the channel CH is turned on, so that an capacitive coupling is generated between the control gate CG and the source S and the drain D. Therefore, if the electric potential of the word line WL is raised in this condition to vary the electric potential of the source S and the drain D, the electric potential of the control gate CG also varies accordingly. The variation of the electric potential of the control gate CG is transmitted to the sense amplifier 2 via the local bit line LBL or LBLB and the global bit line GBL or GBLB.

When the cell data is read, the dummy cell DS corresponding to the object memory cell 1 is selected simultaneously with the memory cell 1. Specifically, an electric potential of 5 V is applied to the source S and the drain D of the dummy cell DS via the dummy word line DWL. The dummy cell DS is constantly set in the erasing condition. Therefore, if the electric potential of the source S and the drain D is varied, the electric potential of the control gate CG of the dummy cell DS also varies. However, since the electrostatic capacity of the dummy cell DS is set to the half of the electrostatic capacity of the memory cell 1, the electric potential variation of the control gate CG also becomes half. The amount of the variation in the electric potential of the control gate CG of the dummy cell DS is transmitted to the sense amplifier 2 via the local bit line LBLB or LBL and the global bit line GBLB or GBL.

Therefore, when the object memory cell 1 is in a writing condition and its control gate CG does not vary in electric potential, the signal voltage transmitted to the sense amplifier 2 from the memory cell 1 via the bit line BL becomes smaller than the reference voltage transmitted from the dummy cell DS via the bit line BLB. The bit lines BL and BLB are set to "0" and "1" by the sense amplifier 2, respectively.

Moreover, when the object memory cell 1 is in an erasing condition and its control gate CG varies in electric potential, the signal voltage transmitted to the sense amplifier 2 from the memory cell 1 via the bit line BL becomes larger than the reference voltage transmitted from the dummy cell DS via the bit line BLB. The bit lines BL and BLB are set to "1" and "0" by the sense amplifier 2, respectively.

As described above, in the non-volatile semiconductor memory of the first embodiment, the cell data is determined by the electric potential variation of the control gate CG without using the electric current. This obviates the necessity of the complicated controls described in the above methods (1) to (4), which have been heretofore performed in the prior art to prevent the excess erasing. Therefore, the structure of the control circuit can be simplified, and the operation speed of the non-volatile semiconductor memory can be enhanced.

The aforementioned first embodiment may be modified as follows. Even in the modifications, the same action and effect as those of the first embodiment can be obtained.

(a) The present invention is applied to the non-volatile semiconductor memory provided with the stacked gate type memory cell in the first embodiment, but the present invention can also be applied to a ferro-electric memory provided with the memory cell 1 having its insulating film replaced with a ferro-electric film or another memory.

(b) The cell array AL has an open-type bit line structure in the first embodiment, but may have a so-called folded-type bit line structure, in which bit lines BL and BLB electrically equivalent to each other are arranged on one side of the differential sense amplifier 2.

(c) In the first embodiment, both of the source S and the drain D are connected to the word line WL, but either the source S or the drain D may be connected to the word line WL. Even when either the source S or the drain D is connected to the word line WL, the electric potential of the control gate CG can be varied in accordance with the condition of the channel CH at the time of reading the cell data.

(d) In order to transmit the reference voltage to the sense amplifier 2, the electrostatic capacity of the dummy cell DS is set to the half of the electrostatic capacity of the memory cell 1 in the first embodiment, but the electrostatic capacity of the dummy cell DS may be set, for example, to the third of the electrostatic capacity of the memory cell 1, i.e., the value other than the half thereof. Specifically, in order to obtain a sufficient margin for correct reading, the reference voltage is preferably set to substantially the intermediate value in the range of a variation in the signal voltage transmitted to the sense amplifier 2 from the memory cell 1 via the bit lines BL and BLB. If there is no parasitic electrostatic capacity in the bit lines LBL and GBL or no variation in the electrostatic capacity of the memory cell 1, by setting the electrostatic capacity of the dummy cell DS to the half of the electrostatic capacity of the memory cell 1, the reference voltage becomes the intermediate value in the range of the variation in the signal voltage. If there is a parasitic capacity in the bit lines LBL and GBL and a variation in the electrostatic capacity of the memory cell 1, by adjusting the electrostatic capacity of the dummy cell DS in accordance with the parasitic capacity or the variation, the reference voltage can be set to substantially the intermediate value in the range of the variation in the signal voltage.

(e) The structure of the dummy cell DS may be the same as that of the memory cell 1. For example, when data is read from the memory cell 1 connected to the local bit line LBL, a plurality of local bit lines LBLB including the local bit line LBLB connected to the dummy cell DS are connected to the sense amplifier 2. In this case, even when the electrostatic capacity of the dummy cell DS is equal to that of the memory cell, the electrostatic capacity coupled to the global bit line GBLB can be varied in accordance with the number of local bit lines LBLB to be connected. By adjusting the electrostatic capacity, the reference voltage may be set, for example, to the intermediate value between the maximum and minimum signal voltage. When the structure of the dummy cell DS is the same as that of the memory cell 1, the production processing is simplified and the yield can be enhanced.

(f) Data is read from one selected memory cell 1 in the first embodiment, but data can simultaneously be read from a plurality of memory cells 1. When the word line WL is selected, the electric potentials of the control gates CG of all memory cells 1 connected to the selected word line WL are varied. Therefore, if a plurality of sense amplifiers 2 connected to the global bit line GBL or GBLB are simultaneously operated, data can be collectively read from the memory cells 1 in a row like in DRAM page mode.

Second Embodiment

The second embodiment of the present invention will be described hereinafter with reference to the drawings. Additionally, the constituting members of the second embodiment identical to those of the first embodiment are denoted with the same reference characters, and the detailed description thereof is not repeated.

Different from the non-volatile semiconductor memory of the first embodiment in which two values (one bit), i.e., the erasing condition and the writing condition are stored in one memory cell 1, a multilevel memory in which three or more values are stored is realized in the second embodiment.

The structure of the memory cells 1 and the cell array AL in the non-volatile semiconductor memory of the second embodiment are the same as those of the first embodiment.

In the second embodiment, when data is written in the memory cell 1, the amount of electric charges supplied to the floating gate FG is controlled to control a threshold voltage of the memory cell. In order to control the amount of electric charges to be supplied to the floating gate FG, the following methods may be used:

[1] The time for supplying electrons to the floating gate FG is adjusted to control the amount of electric charges of the floating gate FG. Specifically, the longer the time for supplying the electrons to the floating gate FG is, the larger the amount of electric charges accumulated in the floating gate FG becomes.

[2] After the electrons are supplied to the floating gate FG for the predetermined time, verification reading is performed. The amount of electric charges of the floating gate FG is controlled by repeating the electron supply and the verification reading.

[3] After electrons are supplied to the floating gate FG for the predetermined time, the verification reading is performed. Subsequently, the electric potentials of the bit lines BL and LBL are slightly raised, electrons are supplied again, and subsequently the verification reading is performed. By repeating the electron supplying and the verification reading, the electric potentials of the bit lines BL and LBL are gradually raised and electrons are supplied. The amount of electric charges of the floating gate FG is thus controlled.

The aforementioned control of the electric charge amount of the floating gate is performed by the control of the control core circuit 200.

As described above, when data is written, by controlling the amount of electric charges supplied to the floating gate FG, the threshold voltage when a data value of "11" is written to the memory cell 1 is regulated, for example, to 0 V or less; the threshold voltage when a data value of "01" is written is regulated, for example, to 2 to 3 V; and the threshold voltage when a data value of "00" is written is regulated, for example, to 6 V or more.

The reading operation for each data value "11", "01" or "00" will be described hereinafter.

<When Data Value "11" is read>

When the data value "11" is written in the object memory cell 1, the threshold voltage is 0 V or less. The condition in which the threshold voltage of the memory cell 1 is 0 V or less corresponds to the excess erasure condition in which the channel CH is constantly turned on.

At the time of reading, first the data value of the high order one bit is read, and the data value of the low order one bit is next read.

In order to read the data value of the high order one bit, first the electric potential of the control gate CG is preset or precharged to 0 V via the bit line BL, and the bit line BL is then opened while being at 0 V. In this case, since the threshold voltage of the memory cell 1 is 0 V or less, the channel CH is turned on, and a capacitive coupling is generated between the control gate CG and the source S and the drain D.

Subsequently, when the source S and the drain D are raised from 0 V to 5 V via the word line WL to vary the electric potential of the source S and the drain D, the electric potential VCGM of the control gate CG of the memory cell 1 varies accordingly to indicate the value shown in equation (1). The electric potential VCGM of the control gate CG is transmitted to the sense amplifier 2, for example, via the local bit line LBL and the global bit line GBL.

$$VCGM = 0 + \alpha \tag{1}$$

where:

$$\alpha = 5 \times C1/C2 \tag{2}$$

where:

C1; the electrostatic capacity by the capacitive coupling generated between the control gate CG and the source S and the drain D of the memory cell 1; and C2: the electrostatic capacity of the bit line BL On the other hand, when the cell data is read, the dummy cell DS corresponding to the object memory cell 1 is selected simultaneously with the memory cell 1. When the source S and the drain D of the dummy cell DS are raised from 0 V to 5 V via the dummy word line DWL to vary the electric potential of the source S and the drain D, the electric potential VCGD of the control gate CG of the dummy cell DS varies accordingly to indicate the value shown in equation (3). If the electrostatic capacity of the dummy cell DS is set to the half of the electrostatic capacity of the memory cell 1, as shown in equation (5), β shown in equation (4) becomes the half value of α shown in equation (3). The electric potential VCGD of the control gate CG is transmitted to the sense amplifier 2, for example, via the local bit line LBLB and the global bit line GBLB.

$$VCGD = 0 + \beta \tag{3}$$

where:

$$\beta = 5 \times C3/C2 \quad (4)$$

and:

$$\beta = \alpha/2 \quad (5)$$

where:

C3 is the electrostatic capacity by the capacitive coupling generated between the control gate CG and the source S and the drain D of the dummy cell DS Subsequently, the electric potentials VCGM, VCGD are compared in the sense amplifier 2. As a result, since the electric potential VCGM is larger than the electric potential VCGD by $\alpha/2$, the data value "1" of the high order one bit is obtained.

Subsequently, the data value of the low order one bit is read.

First, the electric potential of the control gate CG is preset or precharged to 5 V via the bit line BL, and the bit line BL is then opened while being 5 V. In this case, since the threshold voltage of the memory cell 1 is 0 V or less, the channel CH is turned on, and a capacitive coupling is generated between the control gate CG and the source S and the drain D.

Subsequently, when the source S and the drain D are raised from 0 V to 5 V via the word line WL to vary the electric potential of the source S and the drain D, the electric potential VCGM of the control gate CG of the memory cell 1 varies accordingly to indicate the value shown in equation (6). The electric potential VCGM of the control gate CG is transmitted to the sense amplifier 2, for example, via the local bit line LBL and the global bit line GBL.

$$VCGM = 5 + \alpha \quad (6)$$

On the other hand, when the source S and the drain D of the dummy cell DS are raised from 0 V to 5 V via the dummy word line DWL to vary the electric potential of the source S and the drain D, the electric potential VCGD of the control gate CG of the dummy cell DS varies accordingly to indicate the value shown in equation (7). The electric potential VCGD of the control gate CG is transmitted to the sense amplifier 2, for example, via the local bit line LBLB and the global bit line GBLB.

$$VCGD = 5 + \beta = 5 + \alpha/2 \quad (7)$$

Subsequently, the electric potentials VCGM, VCGD are compared in the sense amplifier 2. As a result, since the electric potential VCGM is larger than the electric potential VCGD by $\alpha/2$, the data value "1" of the low order one bit is obtained.

<When Data Value "01" is read>

When the data value "01" is written in the object memory cell 1, the threshold voltage is 2 to 3 V. The condition in which the threshold voltage of the memory cell 1 is 2 to 3 V corresponds to the usual erasing condition.

First, the data value of the high order one bit is read.

The electric potential of the control gate CG is preset to 0 V via the bit line BL, and the bit line BL is then opened while being 0 V. In this case, since the threshold voltage of the memory cell 1 is 2 to 3 V, the channel CH is turned off, and there is little capacitive coupling between the control gate CG and the source S and the drain D. The electrostatic capacity C1 is substantially zero.

Subsequently, when the source S and the drain D are raised from 0 V to 5 V via the word line WL to vary the electric potential of the source S and the drain D, the electric potential VCGM of the control gate CG of the memory cell 1 varies accordingly to indicate the value shown in the equation (1). However, since the electrostatic capacity C1 is substantially zero, the equation (2) indicates that $\alpha$ is zero, while the equation (1) indicates that the electric potential VCGM is zero.

On the other hand, when the source S and the drain D of the dummy cell DS are raised from 0 V to 5 V via the dummy word line DWL to vary the electric potential of the source S and the drain D, the electric potential VCGD of the control gate CG of the dummy cell DS varies accordingly to indicate the value shown in the equation (3). However, since the electrostatic capacity C3 is not zero, the equation (4) indicates that $\beta$ is larger than zero.

Subsequently, the electric potentials VCGM, VCGD are compared in the sense amplifier 2. As a result, since the electric potential VCGM is smaller than the electric potential VCGD by $\beta$, the data value "0" of the high order one bit is obtained.

Next, the data value of the low order one bit is read.

The electric potential of the control gate CG is preset to 5 V via the bit line BL, and the bit line BL is then opened while being 5 V. In this case, since the threshold voltage of the memory cell 1 is 2 to 3 V, the channel CH is turned on, and a capacitive coupling is generated between the control gate CG and the source S and the drain D.

Subsequently, when the source S and the drain D are raised from 0 V to 5 V via the word line WL to vary the electric potential of the source S and the drain D, the electric potential VCGM of the control gate CG of the memory cell 1 varies accordingly to indicate the value shown in the equation (6).

On the other hand, when the source S and the drain D of the dummy cell DS are raised from 0 V to 5 V via the dummy word line DWL to vary the electric potential of the source S and the drain D, the electric potential VCGD of the control gate CG of the dummy cell DS varies accordingly to indicate the value shown in the equation (7).

Subsequently, the electric potentials VCGM, VCGD are compared in the sense amplifier 2. As a result, since the electric potential VCGM is larger than the electric potential VCGD by $\alpha/2$, the data value "1" of the low order one bit is obtained.

<When Data Value "00" is read>

When the data value "00" is written in the object memory cell 1, the threshold voltage is 6 V or more. The condition in which the threshold voltage of the memory cell 1 is 6 V or more corresponds to the usual writing condition.

First, the data value of the high order one bit is read.

The electric potential of the control gate CG is preset to 0 V via the bit line BL, and the bit line BL is then opened while being 0 V. In this case, since the threshold voltage of the memory cell 1 is 6 V or more, the channel CH is turned off, and there is little capacitive coupling between the control gate CG and the source S and the drain D. The electrostatic capacity C1 is substantially zero.

Subsequently, when the source S and the drain D are raised from 0 V to 5 V via the word line WL to vary the electric potential of the source S and the drain D, the electric potential VCGM of the control gate CG of the memory cell 1 varies accordingly to indicate the value shown in the equation (1). However, since the electrostatic capacity C1 is substantially zero, the equation (2) indicates that $\alpha$ is zero, while the equation (1) indicates that the electric potential VCGM is also zero.

On the other hand, when the source S and the drain D of the dummy cell DS are raised from 0 V to 5 V via the dummy word line DWL to vary the electric potential of the source S and the drain D, the electric potential VCGD of the control gate CG of the dummy cell DS varies accordingly to indicate the value shown in the equation (3). However, since the electrostatic capacity C3 is not zero, the equation (4) indicates that β is larger than zero.

Subsequently, the electric potentials VCGM, VCGD are compared in the sense amplifier 2. As a result, since the electric potential VCGM is smaller than the electric potential VCGD by β, the data value "0" of the high order one bit is obtained.

Next, the data value of the low order one bit is read.

The electric potential of the control gate CG is preset to 5 V via the bit line BL, and the bit line BL is then opened while being at 5 V. In this case, since the threshold voltage of the memory cell 1 is 6 V or more, the channel CH is turned off, and there is little capacitive coupling between the control gate CG and the source S and the drain D. The electrostatic capacity C1 is substantially zero.

Subsequently, when the source S and the drain D are raised from 0 V to 5 V via the word line WL to vary the electric potential of the source S and the drain D, the electric potential VCGM of the control gate CG of the memory cell 1 varies accordingly to indicate the value shown in the equation (6). However, since the electrostatic capacity C1 is substantially zero, the equation (2) indicates that α is zero, while the equation (6) indicates that the electric potential VCGM is also zero.

On the other hand, when the source S and the drain D of the dummy cell DS are raised from 0 V to 5 V via the dummy word line DWL to vary the electric potential of the source S and the drain D, the electric potential VCGD of the control gate CG of the dummy cell DS varies accordingly to indicate the value shown in the equation (7). Here, since the electrostatic capacity C3 is not zero, the equation (4) indicates that β is larger than zero.

Subsequently, the electric potentials VCGM, VCGD are compared in the sense amplifier 2. As a result, since the electric potential VCGM is smaller than the electric potential VCGD by β, the data value "0" of the low order one bit is obtained.

As described above, according to the non-volatile semiconductor memory of the second embodiment, three data values written in one memory cell 1, i.e., "11", "01", "00" can easily be read by changing the electric potential of the bit line BL twice, i.e., to 0 V and 5 V.

In the second embodiment, the data value "00" may correspond to the excess writing condition in which the threshold voltage is, for example, 8 V or more.

Four or more data values can be written/read. For example, the intermediate electric potential value is set between 0 V and 5 V to which the electric potential of the bit line BL is varied, the bit line electric potential is varied for three or more times, and the electric potential values may be compared by the sense amplifier 2.

The present invention is not limited to the aforementioned embodiments, and can appropriately be modified and practiced within the range of the spirit of the invention and the scope of the appended claims.

What is claimed is:

1. A non-volatile semiconductor memory device, comprising:

a plurality of memory cells, each of the memory cells comprising a source, a drain, a channel between the source and the drain, a floating gate and a control gate, said floating gate accumulating an electric charge corresponding to a difference between the electric potential of at least one of said source and the drain and the electric potential of said control gate, said channel being allowed to turn on or off in accordance with the condition of the electric charge;

a word line and a bit line for selecting said plurality of memory cells, the word line being connected to at least one of the source and the drain of said memory cell, said bit line being connected to said control gate;

a sense amplifier connected to said bit line for sensing the electric potential of said control gate; and a condition determining circuit for determining whether said memory cell is in an erasing condition or a writing condition in accordance with the output of said sense amplifier when the electric potential of at least one of the source and the drain of said memory cell is varied via said word line.

2. The non-volatile semiconductor memory device according to claim 1, wherein the bit lines form a pair of bit lines arranged symmetrically relative to said sense amplifier and electrically equivalent to each other.

3. The non-volatile semiconductor memory device according to claim 2, wherein said memory cell is connected to one of said pair of bit lines, a dummy cell corresponding to the memory cell is connected to the other bit line, and when at least one of said memory cells is selected, the dummy cell corresponding to the memory cell is simultaneously selected.

4. The non-volatile semiconductor memory device according to claim 3, wherein the electrostatic capacity of said dummy cell is substantially the half of the electrostatic capacity of the corresponding memory cell.

5. The non-volatile semiconductor memory device according to claim 3, wherein said dummy cell has the same structure as the structure of the corresponding memory cell.

6. The non-volatile semiconductor memory device according to claim 3, wherein said dummy cell is set to the erasing condition in which electrons are extracted from the floating gate of said dummy cell.

7. The non-volatile semiconductor memory device according to claim 3, wherein when the electric potential of at least one of said source and the drain of said memory cell and said dummy cell is varied, said sense amplifier refers to the electric potential of said control gate of said dummy cell to sense the electric potential generated in said control gate of said memory cell.

8. The non-volatile semiconductor memory device according to claim 2, wherein each of said pair of bit lines has a local bit line connected to said memory cell and a global bit line connected to said sense amplifier, and said local bit line is connected to said sense amplifier via said global bit line.

9. The non-volatile semiconductor memory device according to claim 8, wherein when data is read from said memory cell, a plurality of said local bit lines including the local bit line connected to said dummy cell are connected to said sense amplifier, and the local bit line other than the local bit line connected to the memory cell is cut from the global bit line connected to the selected memory cell.

10. The non-volatile semiconductor memory device according to claim 1, further comprising an erasing circuit which performs an erasing operation in which said bit line is set to a low electric potential, said word line is set to a high electric potential, and electrons are extracted from said floating gate of the selected memory cell.

11. The non-volatile semiconductor memory device according to claim 1, further comprising a writing circuit which performs a writing operation in which said bit line is set to a high electric potential, said word line is set to a low electric potential, and electrons are supplied to said floating gate of the selected memory cell.

12. The non-volatile semiconductor memory device according to claim 1, wherein the supply of the electrons to said floating gate of said memory cell and the extraction of the electrons from the floating gate are performed by an FN (fowler-nordheim) tunnel current via an insulating film provided between a region between said source and said drain and said floating gate.

13. The non-volatile semiconductor memory device according to claim 1, wherein said memory cell is constituted of a stacked gate type transistor.

14. The non-volatile semiconductor memory device according to claim 1, wherein data is collectively read from the plurality of said memory cells connected to said selected word line by said sense amplifier connected to each bit line.

15. The non-volatile semiconductor memory device according to claim 1, wherein an insulating film is formed using a ferro-electric material between said floating gate and said control gate of said memory cell.

16. The non-volatile semiconductor memory device according to claim 1, wherein said sense amplifier is able to be connected to and disconnected from said bit line via switching means.

17. The non-volatile semiconductor memory device according to claim 1, further comprising a multi-value determining circuit which determines the data value of a high order bit written in said memory cell by determining whether or not the electric potential of said control gate varies when the electric potential of said control gate of said memory cell is set to a first electric potential by said bit line and the electric potential of at least one of the source and the drain of said memory cell is varied by said word line, and which determines the data value of a low order bit written in said memory cell by determining whether or not the electric potential of said control gate varies when the electric potential of said control gate of said memory cell is set to a second electric potential higher than the first electric potential by said bit line and the electric potential of at least one of the source and the drain of said memory cell is then varied by said word line.

18. The non-volatile semiconductor memory device according to claim 17, wherein when the electric potential of said control gate is set to an intermediate electric potential of the first and second electric potentials and the electric potential of at least one of the source and the drain of said memory cell is then varied by said word line, said multi-value determining circuit determines the data value of the intermediate bit of the high and low order bits written in said memory cell by determining whether or not the electric potential of said control gate varies.

* * * * *